United States Patent
Chiu et al.

(10) Patent No.: US 10,388,649 B2
(45) Date of Patent: Aug. 20, 2019

(54) SEMICONDUCTOR DEVICES AND METHODS FOR MANUFACTURING THE SAME

(71) Applicant: Vanguard International Semiconductor Corporation, Hsinchu (TW)

(72) Inventors: Chien-Wei Chiu, Beigang Township (TW); Shin-Cheng Lin, Tainan (TW); Yu-Hao Ho, Keelung (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 15/724,768

(22) Filed: Oct. 4, 2017

(65) Prior Publication Data
US 2019/0103400 A1    Apr. 4, 2019

(51) Int. Cl.
*H01L 21/822*    (2006.01)
*H01L 27/06*    (2006.01)
(Continued)

(52) U.S. Cl.
CPC ...... *H01L 27/0623* (2013.01); *H01L 21/8249* (2013.01); *H01L 21/823481* (2013.01);
(Continued)

(58) Field of Classification Search
CPC ......... H01L 27/0623; H01L 21/823878; H01L 21/823892; H01L 29/0653; H01L 29/7816
USPC ....................................... 257/141
See application file for complete search history.

(56) References Cited

U.S. PATENT DOCUMENTS

2007/0120150 A1 * 5/2007 Meyer .................. H01L 21/761
                                                                            257/213
2007/0272986 A1   11/2007 Williams et al.
(Continued)

FOREIGN PATENT DOCUMENTS

TW    200824117 A    6/2008
TW    201133856 A1   10/2011
TW    201314867 A1    4/2013

OTHER PUBLICATIONS

Taiwanese Office Action and Search Report for Taiwanese Application No. 106130420, dated Apr. 23, 2018.
(Continued)

*Primary Examiner* — Matthew C Landau
*Assistant Examiner* — Dmitriy Yemelyanov
(74) *Attorney, Agent, or Firm* — Birch, Stewart, Kolasch & Birch, LLP

(57) ABSTRACT

A semiconductor device includes a semiconductor substrate having a first conductivity type, wherein the semiconductor substrate includes a first region and a second region. The semiconductor device also includes a buried layer disposed in the first region of the semiconductor substrate and having the first conductivity type, wherein the buried layer has a dopant concentration that is greater than that of the semiconductor substrate. The semiconductor device further includes an epitaxial layer disposed on the semiconductor substrate, and a first element disposed on the first region of the semiconductor substrate, wherein the first element includes a bipolar-complementary metal oxide semiconductor (CMOS)-double diffused metal oxide semiconductor (DMOS) (BCD) transistor. In addition, the semiconductor device includes a second element disposed on the second region of the semiconductor substrate, wherein the second element includes an ultra-high voltage (UHV) transistor.

19 Claims, 6 Drawing Sheets

(51) Int. Cl.
*H01L 29/78* (2006.01)
*H01L 29/06* (2006.01)
*H01L 21/8238* (2006.01)
*H01L 21/8234* (2006.01)
*H01L 21/8249* (2006.01)
*H01L 29/66* (2006.01)
*H01L 29/10* (2006.01)

(52) U.S. Cl.
CPC ............... *H01L 21/823493* (2013.01); *H01L 21/823878* (2013.01); *H01L 21/823892* (2013.01); *H01L 29/0653* (2013.01); *H01L 29/1083* (2013.01); *H01L 29/66659* (2013.01); *H01L 29/66681* (2013.01); *H01L 29/7816* (2013.01); *H01L 29/7835* (2013.01)

(56) References Cited

U.S. PATENT DOCUMENTS

| | | |
|---|---|---|
| 2010/0258867 A1 | 10/2010 | Lee et al. |
| 2010/0301413 A1* | 12/2010 | You ................ H01L 27/0922 257/343 |
| 2011/0057262 A1 | 3/2011 | Ma et al. |
| 2011/0248342 A1 | 10/2011 | Kim et al. |
| 2013/0037883 A1 | 2/2013 | Huang et al. |
| 2013/0049113 A1* | 2/2013 | Jung ................ H01L 29/42368 257/337 |

OTHER PUBLICATIONS

Taiwanese Office Adtion and Search Report, dated Jan. 29, 2019, for Taiwanese Application No. 106130420.

* cited by examiner

SEMICONDUCTOR DEVICES AND METHODS FOR MANUFACTURING THE SAME

BACKGROUND

Field of the Invention

The invention relates to semiconductor devices, and in particular to a semiconductor device having different types of elements integrated together and methods for manufacturing the same.

Description of the Related Art

A Bipolar-Complementary metal oxide semiconductor (CMOS)-Double diffused metal oxide semiconductor (DMOS), hereinafter abbreviated as BCD, is a system-on-chip (SoC) process. The process can form smart power integrated circuits. Moreover, bipolar transistors, CMOS transistors and DMOS transistors can be manufactured on the same chip using this process.

The BCD process can effectively integrate power chips. The advantages of the BCD process include saving on packaging costs, reducing power consumption, and increasing system performance. As electronic products become smaller and denser, the BCD process is being used in manufacturing semiconductor devices more and more frequently.

BRIEF SUMMARY

Embodiments of semiconductor devices—particularly semiconductor devices having a BCD transistor and an ultra-high voltage (UHV) transistor integrated therein—and methods for manufacturing the same are provided.

In some embodiments of the disclosure, a semiconductor substrate is divided into a first region and a second region. A first element including a BCD transistor is disposed in the first region, and a second element including an UHV transistor is disposed in the second region. A patterned mask covering the second region is formed before an epitaxial process is performed. The patterned mask is utilized to perform a doping process on the first region, such that a buried layer is formed in the first region. The buried layer has the same conductivity type as the semiconductor substrate, and the buried layer has a dopant concentration that is greater than that of the semiconductor substrate. Therefore, the latch-up effect generated by the BCD transistor disposed in the first region of the semiconductor substrate can be prevented. As a result, the burnout of the BCD transistor caused by short circuits can be prevented.

Moreover, the above-mentioned patterned mask can be utilized to prevent a buried layer having the same dopant concentration as the buried layer in the first region of the semiconductor substrate (i.e. the region where the BCD transistor is disposed) from forming in the second region of the semiconductor substrate (i.e. the region where the UHV transistor is disposed). As a result, failure of the UHV transistor can be prevented, and the breakdown voltage of the UHV transistor can be effectively maintained. The buried layer can be disposed in the first region of the semiconductor substrate by the above-mentioned patterned mask. Since the buried layer does not extend to the second region of the semiconductor substrate, the BCD transistor and the UHV transistor can be successfully integrated on the same semiconductor device. And then, the latch-up effect can be prevented and the breakdown voltage can be increased at the same time.

Some embodiments of the disclosure provide a semiconductor device. The semiconductor device includes a semiconductor substrate having a first conductivity type, wherein the semiconductor substrate includes a first region and a second region. The semiconductor device also includes a buried layer disposed in the first region of the semiconductor substrate and having the first conductivity type, wherein the buried layer has a dopant concentration that is greater than that of the semiconductor substrate. The semiconductor device further includes an epitaxial layer disposed on the semiconductor substrate, and a first element disposed on the first region of the semiconductor substrate, wherein the first element includes a bipolar-complementary metal oxide semiconductor (CMOS)-double diffused metal oxide semiconductor (DMOS) (BCD) transistor. In addition, the semiconductor device includes a second element disposed on the second region of the semiconductor substrate, wherein the second element includes an ultra-high voltage transistor.

Some embodiments of the disclosure provide a method for forming a semiconductor device. The method includes providing a semiconductor substrate having a first conductivity type, wherein the semiconductor substrate comprises a first region and a second region. The method also includes forming a patterned mask on the second region of the semiconductor substrate, and performing a doping process on the semiconductor substrate by using the patterned mask to form a buried layer in the first region, wherein the buried layer has the first conductivity type, and the buried layer has a dopant concentration that is higher than that of the semiconductor substrate. The method further includes forming an epitaxial layer on the semiconductor substrate, and forming a first element on the first region of the semiconductor substrate, wherein the first element comprises a bipolar-CMOS-DMOS transistor. In addition, the method includes forming a second element on the second region of the semiconductor substrate, wherein the second element comprises an ultra-high voltage transistor.

A detailed description is given in the following embodiments with reference to the accompanying drawings.

BRIEF DESCRIPTION OF THE DRAWINGS

The disclosure can be more fully understood from the following detailed description when read with the accompanying figures. It is worth noting that, in accordance with the standard practice in the industry, various features are not drawn to scale. In fact, the dimensions of the various features may be arbitrarily increased or reduced for clarity of discussion.

DETAILED DESCRIPTION OF THE INVENTION

Figure 1:
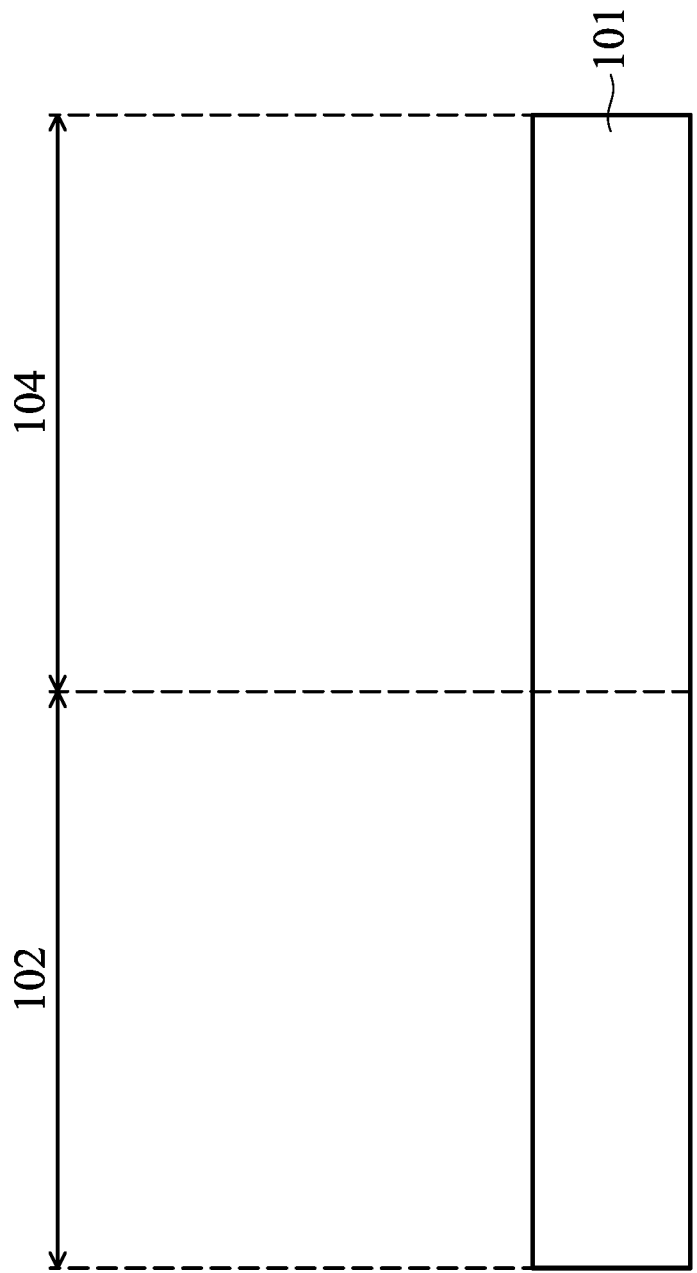
FIGS. 1 to 6 are cross-sectional views illustrating an exemplary sequential forming process of a semiconductor device in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first component over or on a second component in the description that follows may include embodiments in which the first and second components are formed in direct contact, and may also include embodiments in which additional components may be formed between the first and second components, such that the first and second components may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some embodiments are described below. Throughout the various views and illustrative embodiments, like reference numbers are used to designate like elements. It should be understood that additional operations can be provided before, during, and after the method, and some of the operations described can be replaced or eliminated for other embodiments of the method.

Figure 4:
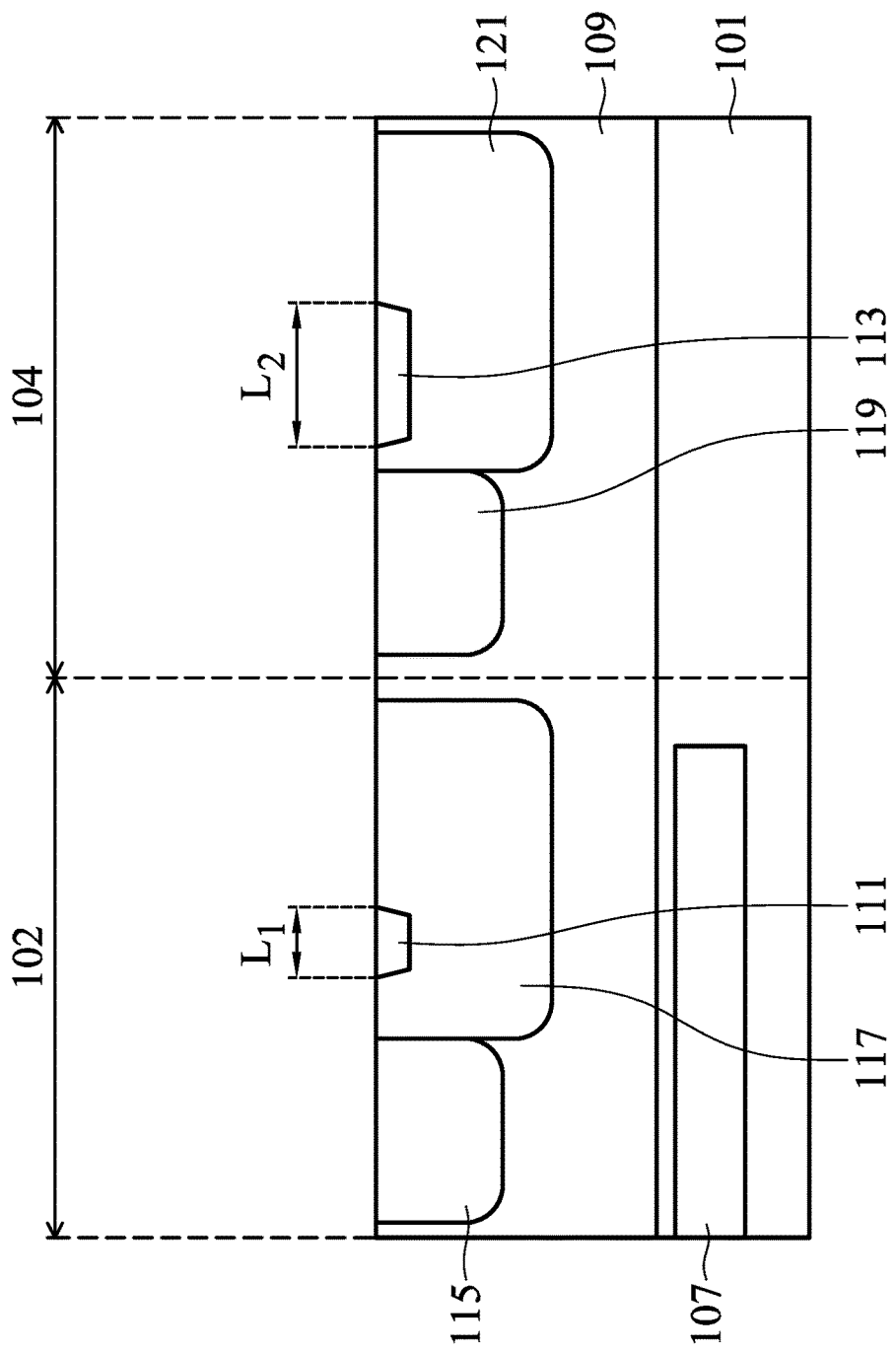
Figure 5:
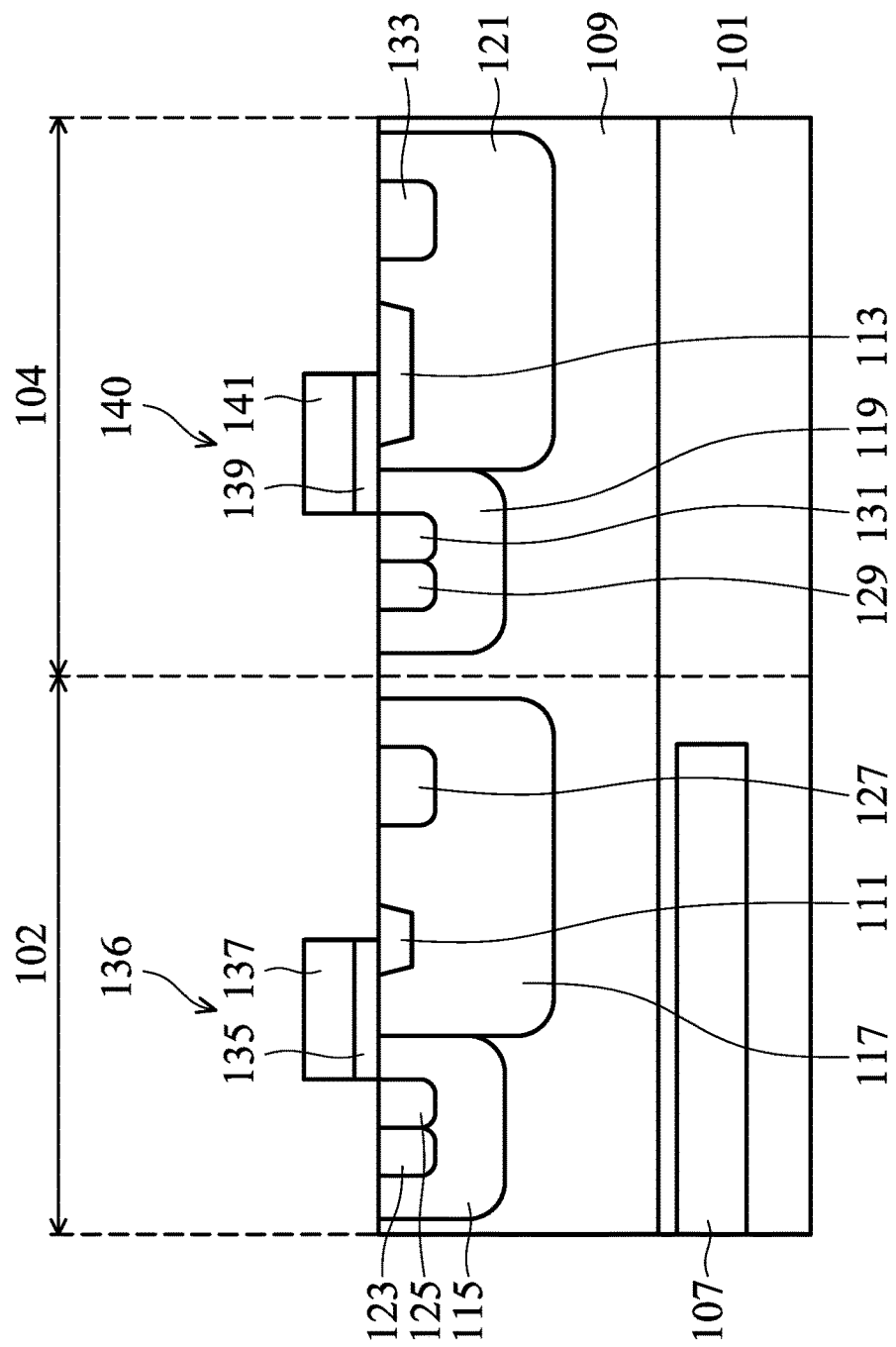
Figure 6:
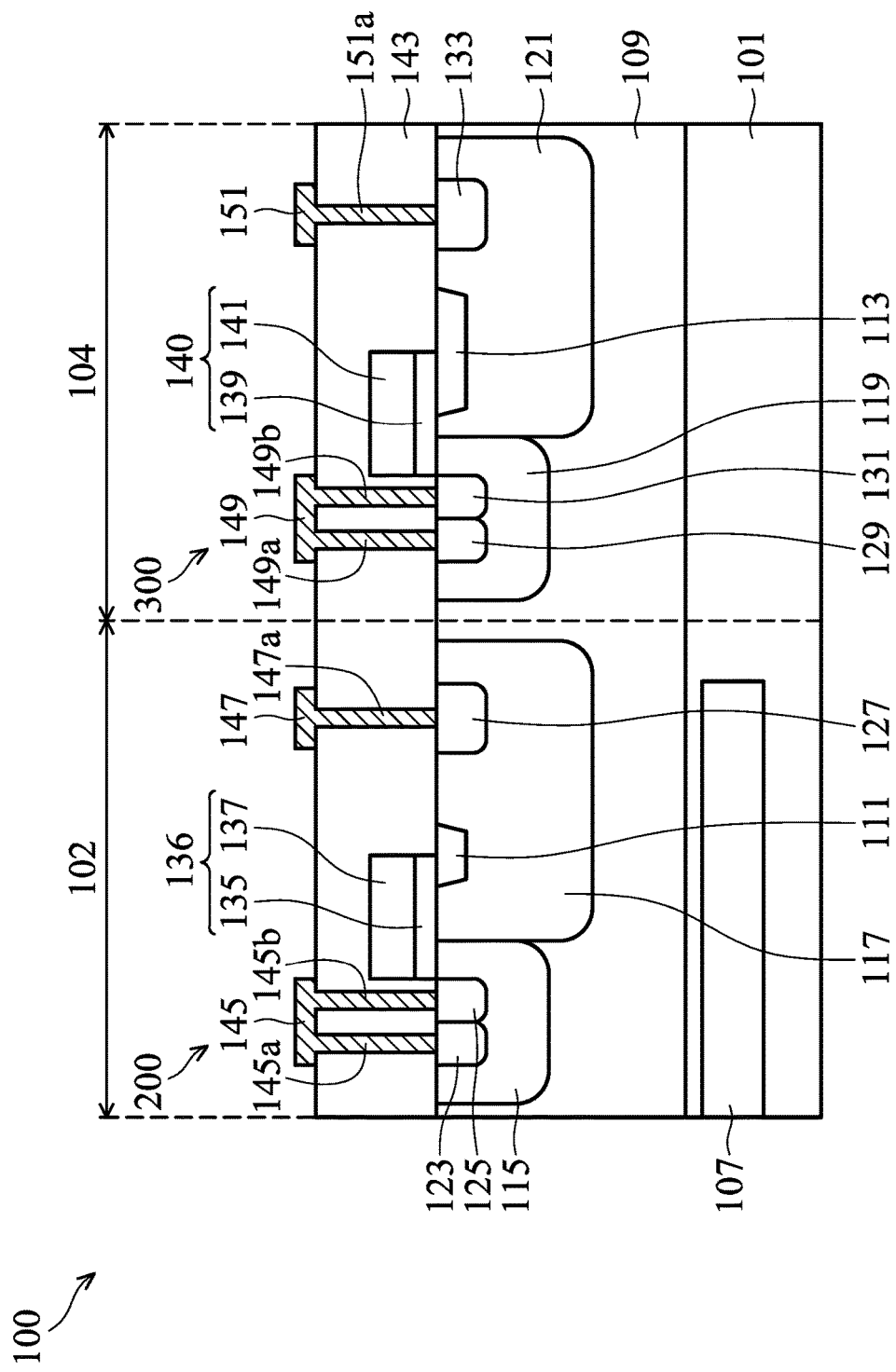

FIGS. 1 to 6 are cross-sectional views illustrating an exemplary sequential forming process of a semiconductor device 100 as shown in FIG. 6 in accordance with some embodiments, wherein the semiconductor device 100 includes a first element 200 and a second element 300.

As shown in FIG. 1, a semiconductor substrate 101 is provided, in accordance with some embodiments. In some embodiments, the semiconductor substrate 101 may be made of silicon or another semiconductor material. Alternatively, the semiconductor substrate 101 may include other elementary semiconductor materials such as germanium (Ge). In some embodiments, the semiconductor substrate 101 is made of a compound semiconductor such as silicon carbide, gallium nitride, gallium arsenic, indium arsenide, or indium phosphide. In some embodiments, the semiconductor substrate 101 is made of an alloy semiconductor such as silicon germanium, silicon germanium carbide, gallium arsenic phosphide, or gallium indium phosphide. In some embodiment, the semiconductor substrate 101 includes a silicon-on-insulator (SOI) substrate. In some embodiments, the semiconductor substrate 101 has a first conductivity type, for example, the semiconductor substrate 101 is a lightly doped p-type substrate in the present embodiment. However, in other embodiments, the semiconductor substrate 101 may be a lightly doped n-type substrate.

Next, as shown in FIG. 1, the semiconductor substrate 101 is divided into a first region 102 and a second region 104. The first region 102 is a region where a BCD transistor of the first element 200 is formed in the following processes (referring to FIG. 6), and the second region 104 is a region where an UHV transistor of the second element 300 is formed in the following processes (referring to FIG. 6). The locations of the first region 102 and the second region 104 can be arbitrarily adjusted according to the configuration requirements for the semiconductor device. In some embodiments, the first region 102 is adjacent to the second region 104. In other embodiments, the first region 102 and the second region 104 may be separated by other regions.

Figure 2:
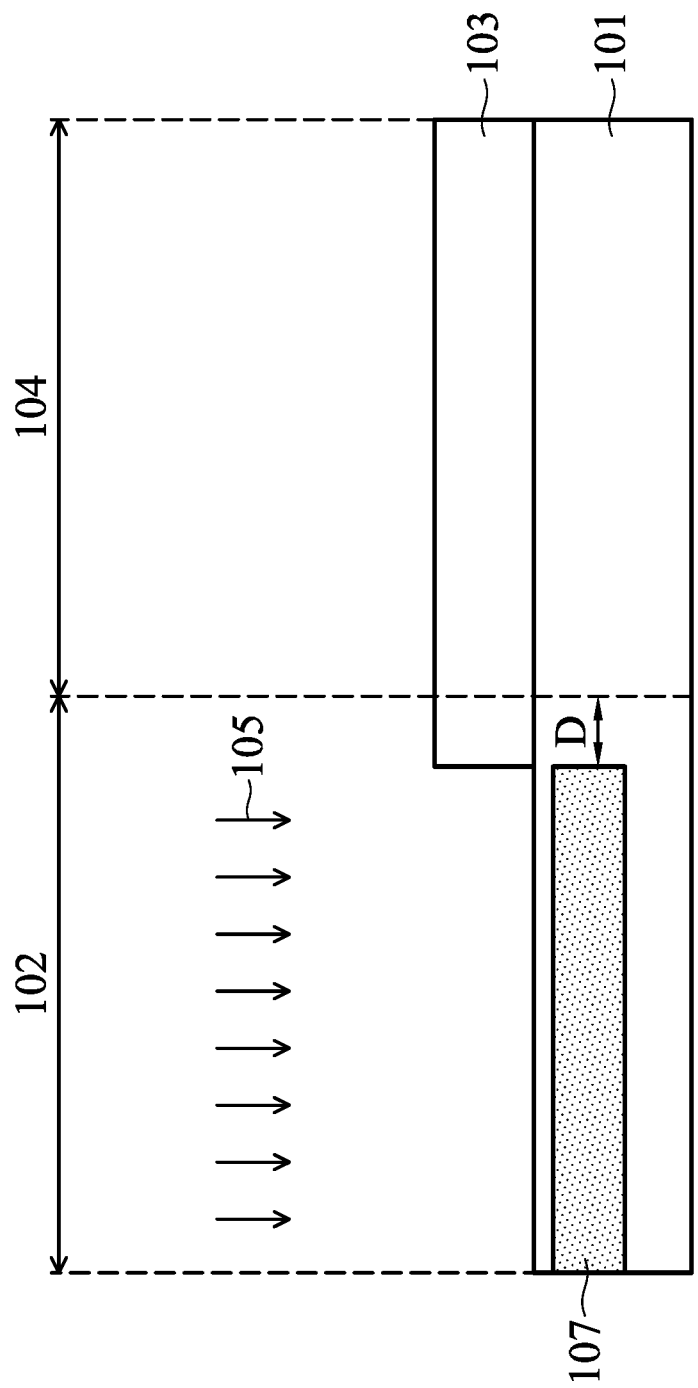

As shown in FIG. 2, a patterned mask 103 is formed on the second region 104 of the semiconductor substrate 101, in accordance with some embodiments. In some embodiments, a mask layer (not shown) is formed on the semiconductor substrate 101. Then, the mask layer is patterned by performing a patterning process to form a patterned mask 103. The patterning process includes a photolithography process and an etching process. The photolithography process includes photoresist coating (e.g., spin-on coating), soft baking, mask aligning, exposure, post-exposure baking, developing the photoresist, rinsing and drying (e.g., hard baking). The etching process includes a dry etching process or a wet etching process.

In some embodiments, the second region 104 of the semiconductor substrate 101 is entirely covered by the patterned mask 103, and the patterned mask 103 extends onto the first region 102 to cover a portion of the first region 102 of the semiconductor substrate 101. In other words, a portion of the first region 102 of the semiconductor substrate 101 is exposed by the patterned mask 103.

Then, a doping process 105 is performed. A buried layer 107 is formed in the first region 102 of the semiconductor substrate 101 by utilizing the patterned mask 103, and the buried layer 107 has the first conductivity type, which is the same as the conductivity type of the semiconductor substrate 101. In some embodiments, the doping process 105 includes an ion implantation process. P-type dopants, such as boron (B), can be implanted in the first region 102 of the p-type semiconductor substrate 101, or N-type dopants, such as phosphorous (P) or arsenic (As), can be implanted in the n-type semiconductor substrate 101. After performing the doping process 105, the buried layer 107 has the same conductivity type as the semiconductor substrate 101, and the dopant concentration of the buried layer 107 is higher than the dopant concentration of the semiconductor substrate 101.

In the present embodiment, the conductivity types of the buried layer 107 and the semiconductor substrate 101 are p-type, and the dopant concentration of the buried layer 107 is in a range from about $1\times10^{15}$ atoms/cm$^3$ to about $1\times10^{18}$ atoms/cm$^3$, and the dopant concentration of the semiconductor substrate 101 is in a range from about $1\times10^{14}$ atoms/cm$^3$ to about $1\times10^{16}$ atoms/cm$^3$.

It is worth noting that, in some embodiments, the patterned mask 103 extends onto the first region 102 of the semiconductor substrate 101, such that the buried layer 107 formed by utilizing the patterned mask 103 is entirely located in the first region 102. That is, the range of the buried layer 107 is narrower than or equal to the range of the first region 102 (the dopants in the buried layer 107 may diffuse outward so that the range of the buried layer 107 is equal to the range of the first region 102). As shown in FIG. 2, in some embodiments, there is a distance D from the boundary of the buried layer 107 close to the second region 104 to the interface between the first region 102 and the second region 104. In some embodiments, the distance D is in a range from about 1 μm to about 100 μm. The distance D is a reserved distance for the doping process 105, which is used to ensure the dopants of the buried layer 107 cannot diffuse into the second region 104 of the semiconductor substrate 101.

Figure 3:
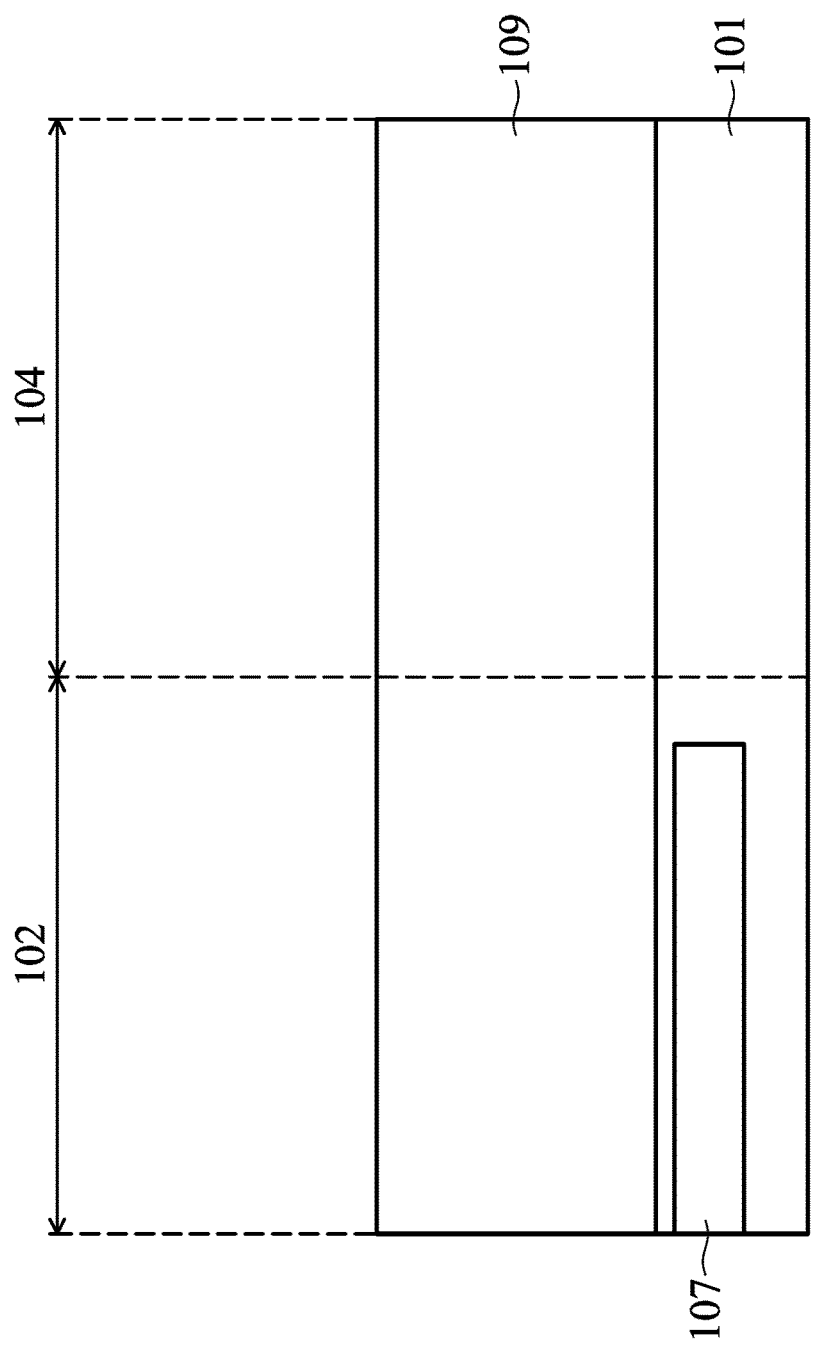

As shown in FIG. 3, in accordance with some embodiments, the patterned mask 103 is removed after the buried layer 107 is formed, and an epitaxial layer 109 is formed on the semiconductor substrate 101. In some embodiments, the epitaxial layer 109 may be N-type or P-type. The epitaxial layer 109 is formed on the first region 102 and the second region 104 of the semiconductor substrate 101, and may be formed by metal organic chemical vapor deposition (MOCVD), plasma enhanced chemical vapor deposition (PECVD), molecular beam epitaxy (MBE), hydride vapor phase epitaxy (HVPE), liquid phase epitaxy (LPE), chloride-vapor phase epitaxy (Cl-VPE), another similar process, or a combination thereof.

In addition, in some embodiments, a portion of the semiconductor substrate 101 is located between the buried layer 107 and the epitaxial layer 109. That is, the buried layer 107 is entirely located in the semiconductor substrate

101. The buried layer 107 is not exposed on the top surface of the semiconductor substrate 101.

Next, as shown in FIG. 4, a first isolation structure 111 and a second isolation structure 113 are formed in the epitaxial layer 109 and close to the top surface of the epitaxial layer 109. The first isolation structure 111 is located in the first region 102, and the second isolation structure 113 is located in the second region 104. In the present embodiment, the first isolation structure 111 and the second isolation structure 113 are shallow trench isolation (STI) structures. In other embodiments, the first isolation structure 111 and the second isolation structure 113 are local oxidation of silicon (LOCOS) structures (not shown), and a portion of the first isolation structure 111 and the second isolation structure 113 are embedded in the epitaxial layer 109, and another portion of the first isolation structure 111 and the second isolation structure 113 are formed on the epitaxial layer 109.

In some embodiments, the first isolation structure 111 and the second isolation structure 113 are shallow trench isolation (STI) structures, and may be formed by etching and chemical vapor deposition (CVD) process. In other embodiments, the first isolation structure 111 and the second isolation structure 113 are local oxidation of silicon (LOCOS) structures, and may be formed by a chemical vapor deposition (CVD) process and a thermal oxidation process. Moreover, the first isolation structure 111 and the second isolation structure 113 are made of silicon oxide, silicon nitride, silicon oxynitride or another applicable dielectric material.

In some embodiments, the first isolation structure 111 and the second isolation structure 113 may be formed by a thermal oxidation process, a chemical vapor deposition (CVD) process, or a combination thereof, according to the types of the isolation structures. In addition, the first isolation structure 111 and the second isolation structure 113 are made of silicon oxide, silicon nitride, silicon oxynitride or another applicable dielectric material.

It is worth noting that, in the cross-sectional view of FIG. 4, the first isolation structure 111 has a first length L1, the second isolation structure 113 has a second length L2, and the second length L2 is greater than the first length L1. In some embodiments, the first length L1 is in a range from about 0.3 µm to about 3 µm, and the second length L2 is in a range from about 10 µm to about 50 µm.

The first isolation structure 111 is the isolation structure of the BCD transistor of the first element 200 formed subsequently, and the second isolation structure 113 is the isolation structure of the UHV transistor of the second element 300 formed subsequently. To tolerate high voltages, for example, in a range from about 300 volts to about 800 volts, the second length L2 of the second isolation structure 113 is greater than the first length L1 of the first isolation structure 111.

Still referring to FIG. 4, a first well region 115, a second well region 117, a third well region 119 and a fourth well region 121 is formed in the epitaxial layer 109. The first well region 115 and the second well region 117 are located on the first region 102 of the semiconductor substrate 101, and directly above the buried layer 107. In some embodiments, the projections of the second well region 117 and the buried layer 107 along the vertical direction of the surface of the semiconductor substrate 101 overlap. The projection range of the second well region 117 along the vertical direction of the surface of the semiconductor substrate 101 exceeds the projection range of the buried layer 107 along the vertical direction of the surface of the semiconductor substrate 101. In other embodiments, the projection range of the second well region 117 along the vertical direction of the surface of the semiconductor substrate 101 is entirely located in the range of the buried layer 107. In addition, the third well region 119 and the fourth well region 121 are located on the second region 104 of the semiconductor substrate 101. The projections of the third well region 119, the fourth well region 121 and the buried layer 107 along the vertical direction of the surface of the semiconductor substrate 101 are completely non-overlapping.

In some embodiments, the first isolation structure 111 is located in the second well region 117, and the second isolation structure 113 is located in the fourth well region 121. The second well region 117 is adjacent to the first well region 115, and the fourth well region 121 is adjacent to the third well region 119.

Moreover, the first well region 115 and the third well region 119 have the first conductivity type (In the embodiment of the P-type semiconductor substrate 101, the first well region 115 and the third well region 119 may be P-type, for example), and the second well region 117 and the fourth well region 121 have a second conductivity type opposite to the first conductivity type (In the embodiment of the P-type semiconductor substrate 101, the second well region 117 and the fourth well region 121 may be N-type, for example). The first well region 115, the second well region 117, the third well region 119 and the fourth well region 121 may be formed by ion implantation. In some embodiments, the first well region 115 and the third well region 119 may be formed in the same step of the ion implantation process, and the second well region 117 and the fourth well region 121 may be formed in another step of the ion implantation process.

As shown in FIG. 5, a first gate structure 136 and a second gate structure 140 are formed on the epitaxial layer 109, in accordance with some embodiments. The first gate structure 136 is located above the interface between the first well region 115 and the second well region 117, and a portion of the first isolation structure 111 is covered by the first gate structure 136. The second gate structure 140 is located above the interface between the third well region 119 and the fourth well region 121, and a portion of the second isolation structure 113 is covered by the second gate structure 140.

In some embodiments, the first gate structure 136 includes a first gate dielectric layer 135 and a first gate electrode layer 137 disposed on the first gate dielectric layer 135. The second gate structure 140 includes a second gate dielectric layer 139 and a second gate electrode layer 141 disposed on the second gate dielectric layer 139.

The first gate dielectric layer 135 and the second gate dielectric layer 139 may be made of silicon oxide, silicon nitride, silicon oxynitride, a dielectric material having a high dielectric constant (high-k), or a combination thereof. In some embodiments, the first gate dielectric layer 135 and the second gate dielectric layer 139 are formed in the same step of the plasma enhanced chemical vapor deposition (PECVD) process or the spin coating process.

The first gate electrode layer 137 and the second gate electrode layer 141 are made of conductive materials, such as aluminum (Al), copper (Cu), tungsten (W), titanium (Ti), tantalum (Ta), polysilicon, or another applicable material. In some embodiments, the first gate electrode layer 137 and the second gate electrode layer 141 are formed by a deposition process and a patterning process. The deposition process may be a chemical vapor deposition (CVD) process, a physical vapor deposition (PVD) process, an atomic layer deposition (ALD) process, a high density plasma chemical vapor deposition (HDPCVD) process, a metal organic chemical vapor deposition (MOCVD) process, a plasma enhanced chemical vapor deposition (PECVD) process, or a combination thereof. The patterning process may include a photolithography process and an etching process.

Still referring to FIG. 5, a first doped region 123 and a second doped region 125 are formed in the first well region 115. A third doped region 127 is formed in the second well region 117. A fourth doped region 129 and a fifth doped region 131 are formed in the third well region 119. A sixth doped region 133 is formed in the fourth well region 121. In addition, the first doped region 123 is adjacent to the second doped region 125, and the fourth doped region 129 is adjacent to the fifth doped region 131.

In some embodiments, the first doped region 123 and the fourth doped region 129 have the first conductivity type (In the embodiment of the P-type semiconductor substrate 101, the first doped region 123 and the fourth doped region 129 may be P-type, for example). The second doped region 125, the third doped region 127, the fifth doped region 131 and the sixth doped region 133 have the second conductivity type (In the embodiment of the P-type semiconductor substrate 101, the second doped region 125, the third doped region 127, the fifth doped region 131 and the sixth doped region 133 may be N-type, for example). In some embodiments, the dopant concentrations of the first doped region 123, the second doped region 125, the third doped region 127, the fourth doped region 129, the fifth doped region 131 and the sixth doped region 133 are in a range from about $1 \times 10^{15}$ atoms/cm$^3$ to about $1 \times 10^{18}$ atoms/cm$^3$.

As shown in FIG. 6, an inter-layer dielectric (ILD) layer 143 is formed on the epitaxial layer 109, the first gate structure 136 and the second gate structure 140, in accordance with some embodiments. In some embodiments, the inter-layer dielectric layer 143 may be made of silicon oxide, silicon nitride, phosphosilicate glass (PSG), borophosphosilicate glass (BPSG), and/or another applicable dielectric material. The inter-layer dielectric layer 143 may be formed by a chemical vapor deposition (CVD) process, a physical vapor deposition (PVD) process, an atomic layer deposition (ALD) process, a spin-on coating process, or another applicable process.

After the inter-layer dielectric layer 143 is formed, a first source electrode 145, a first drain electrode 147, a second source electrode 149 and a second drain electrode 151 are formed on the inter-layer dielectric layer 143. Moreover, vias 145a, 145b, 147a, 149a, 149b and 151a are formed in the inter-layer dielectric layer 143.

The first source electrode 145 is electrically connected to the first doped region 123 and the second doped region 125 through the via 145a and the via 145b respectively. The first drain electrode 147 is electrically connected to the third doped region 127 through the via 147a. Moreover, the second source electrode 149 is electrically connected to the fourth doped region 129 and the fifth doped region 131 through the via 149a and the via 149b respectively. The second drain electrode 151 is electrically connected to the sixth doped region 133 through the via 151a. In some embodiments, the first source electrode 145, the first drain electrode 147, the second source electrode 149, the second drain electrode 151 and the vias 145a, 145b, 149a, 149a, 149b, 151a may include metals or other applicable conductive materials.

After the first source electrode 145, the first drain electrode 147, the second source electrode 149 and the second drain electrode 151 are formed, the semiconductor device 100 is completed. The semiconductor device 100 includes the first element 200 and the second element 300. The first element 200 includes the BCD transistor, and the second element 300 includes the UHV transistor. The BCD transistor of the first element 200 is located on the first region 102 of the semiconductor substrate 101, and the UHV transistor of the second element 300 is located on the second region 104 of the semiconductor substrate 101.

In some embodiments, the UHV transistor of the second element 300 can tolerate high voltage which is more than about 500 volts. In addition, a medium-voltage element which can tolerate about 30 volts may be disposed on the second region 104 of the semiconductor substrate 101. Because of the existence of the medium-voltage element, the latch-up effect is no longer a problem in the second region 104 of the semiconductor substrate 101. Therefore, to avoid the problem of latch-up effect, a buried layer is no needed in the second region 104 of the semiconductor substrate 101.

Moreover, the circuit configurations in the BCD transistor of the first element 200 and the UHV transistor of the second element 300 should not limited to the teachings of FIG. 6. In other embodiments, the BCD transistor of the first element 200 and the UHV transistor of the second element 300 may be integrated on the same substrate, and the first element 200 and the second element 300 may include other active and/or passive elements.

In the present embodiment, the buried layer 107 in the first region 102 of the semiconductor substrate 101 is a continuous doping material layer. In other embodiments, the buried layer 107 may be a discontinuous doping material layer located in the first region 102 of the semiconductor substrate 101. In yet other embodiments, another buried layer (not shown) is formed in the second region 104 of the semiconductor substrate 101, the buried layer in the second region 104 is formed by utilizing another patterned mask covering the first region 102 of the semiconductor substrate 101, and the dopant concentration of the buried layer in the second region 104 is far lower than the dopant concentration of the buried layer 107 in the first region 102. The dopant concentration of the buried layer in the second region 104 may be in a range from about $1 \times 10^{15}$ atoms/cm$^3$ to about $1 \times 10^{17}$ atoms/cm$^3$, for example, which is lower than the dopant concentration of the above-mentioned buried layer 107 of the first region 102 (from about $1 \times 10^{15}$ atoms/cm$^3$ to about $1 \times 10^{18}$ atoms/cm$^3$).

In some embodiments of the disclosure, a semiconductor substrate is divided into a first region and a second region. A first element including a BCD transistor is disposed in the first region, and a second element including an UHV transistor is disposed in the second region. A patterned mask covering the second region is formed before an epitaxial process is performed. The patterned mask is utilized to perform a doping process on the first region, such that a buried layer is formed in the first region. The buried layer has the same conductivity type as the semiconductor substrate, and the buried layer has a dopant concentration that is greater than that of the semiconductor substrate. Therefore, the latch-up effect generated by the BCD transistor disposed in the first region of the semiconductor substrate can be prevented. As a result, the burnout of the BCD transistor caused by short circuits can be prevented.

Moreover, the above-mentioned patterned mask can be utilized to prevent a buried layer having the same dopant concentration as the buried layer in the first region of the semiconductor substrate (i.e. the region where the BCD transistor is disposed) from forming in the second region of the semiconductor substrate (i.e. the region where the UHV transistor is disposed). As a result, the failure of the UHV transistor can be prevented, and the breakdown voltage of the UHV transistor can be effectively maintained. The buried layer can be disposed in the first region of the semiconductor substrate by the above-mentioned patterned mask. Since the buried layer does not extend to the second region of the semiconductor substrate, the BCD transistor and the UHV transistor can be successfully integrated on the same semiconductor device. And then, the latch-up effect can be prevented and the breakdown voltage can be increased at the same time.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a semiconductor substrate having a first conductivity type, wherein the semiconductor substrate comprises a first region and a second region;
    a buried layer disposed in the first region of the semiconductor substrate and having the first conductivity type, wherein the buried layer has a dopant concentration that is higher than that of the semiconductor substrate;
    an epitaxial layer disposed on the semiconductor substrate, wherein a portion of the semiconductor substrate is disposed between the buried layer and the epitaxial layer;
    a first element disposed on the first region of the semiconductor substrate, wherein the first element comprises a bipolar-complementary metal oxide semiconductor (CMOS)-double diffused metal oxide semiconductor (DMOS) (BCD) transistor; and
    a second element disposed on the second region of the semiconductor substrate, wherein the second element comprises an ultra-high voltage transistor.

2. The semiconductor device as claimed in claim 1, wherein the buried layer has a range that is narrower than or equal to that of the first region.

3. The semiconductor device as claimed in claim 1, wherein the bipolar-CMOS-DMOS transistor has a first isolation structure, the ultra-high voltage transistor has a second isolation structure, and the second isolation structure has a length that is greater than that of the first isolation structure.

4. The semiconductor device as claimed in claim 3, wherein the bipolar-CMOS-DMOS transistor comprises:
    a first well region disposed in the epitaxial layer and having the first conductivity type;
    a second well region disposed in the epitaxial layer and adjacent to the first well region, wherein the second well region has a second conductivity type opposite to the first conductivity type, and the first isolation structure is located in the second well region; and
    a first gate structure disposed on the epitaxial layer and located above an interface between the first well region and the second well region, wherein a portion of the first isolation structure is covered by the first gate structure.

5. The semiconductor device as claimed in claim 4, wherein the bipolar-CMOS-DMOS transistor further comprises:
    a first doped region and a second doped region disposed in the first well region, wherein the first doped region has the first conductivity type, and the second doped region has the second conductivity type; and
    a third doped region disposed in the second well region and having the second conductivity type.

6. The semiconductor device as claimed in claim 5, wherein the bipolar-CMOS-DMOS transistor further comprises:
    a first source electrode and a first drain electrode disposed on the epitaxial layer, wherein the first source electrode is electrically connected to the first doped region and the second doped region, and the first drain electrode is electrically connected to the third doped region.

7. The semiconductor device as claimed in claim 3, wherein the ultra-high voltage transistor comprises:
    a third well region disposed in the epitaxial layer and having the first conductivity type;
    a fourth well region disposed in the epitaxial layer and adjacent to the third well region, wherein the fourth well region has a second conductivity type opposite to the first conductivity type, and the second isolation structure is located in the fourth well region; and
    a second gate structure disposed on the epitaxial layer and located above an interface between the third well region and the fourth well region, wherein a portion of the second isolation structure is covered by the second gate structure.

8. The semiconductor device as claimed in claim 7, wherein the ultra-high voltage transistor further comprises:
    a fourth doped region and a fifth doped region disposed in the third well region, wherein the fourth doped region has the first conductivity type, and the fifth doped region has the second conductivity type; and
    a sixth doped region disposed in the fourth well region and having the second conductivity type.

9. The semiconductor device as claimed in claim 8, wherein the ultra-high voltage transistor further comprises:
    a second source electrode and a second drain electrode disposed on the epitaxial layer, wherein the second source electrode is electrically connected to the fourth doped region and the fifth doped region, and the second drain electrode is electrically connected to the sixth doped region.

10. A method for manufacturing a semiconductor device, comprising:
    providing a semiconductor substrate having a first conductivity type, wherein the semiconductor substrate comprises a first region and a second region;
    forming a patterned mask on the second region of the semiconductor substrate;
    performing a doping process on the semiconductor substrate by using the patterned mask to form a buried layer in the first region, wherein the buried layer has the first conductivity type, and the buried layer has a dopant concentration that is higher than that of the semiconductor substrate;
    forming an epitaxial layer on the semiconductor substrate, wherein a portion of the semiconductor substrate is disposed between the buried layer and the epitaxial layer;
    forming a first element on the first region of the semiconductor substrate, wherein the first element comprises a bipolar-CMOS-DMOS transistor; and forming a second element on the second region of the semiconductor substrate, wherein the second element comprises an ultra-high voltage transistor.

11. The method as claimed in claim 10, wherein the patterned mask is formed before the epitaxial layer is formed, the second region is entirely covered by the patterned mask, and the patterned mask extends onto a portion of the first region.

12. The method as claimed in claim 10, wherein the buried layer has a range that is narrower than or equal to that of the first region.

13. The method as claimed in claim 10, wherein the bipolar-CMOS-DMOS transistor has a first isolation structure, the ultra-high voltage transistor has a second isolation structure, and the second isolation structure has a length that is greater than that of the first isolation structure.

14. The method as claimed in claim 13, wherein forming the bipolar-CMOS-DMOS transistor comprises:
  forming a first well region in the epitaxial layer, wherein the first well region has the first conductivity type;
  forming a second well region in the epitaxial layer, wherein the second well region is adjacent to the first well region and has a second conductivity type opposite to the first conductivity type, and the first isolation structure is formed in the second well region; and
  forming a first gate structure on the epitaxial layer, wherein the first gate structure is located above an interface between the first well region and the second well region, and a portion of the first isolation structure is covered by the first gate structure.

15. The method as claimed in claim 14, wherein forming the bipolar-CMOS-DMOS transistor further comprises:
  forming a first doped region and a second doped region in the first well region, wherein the first doped region has the first conductivity type, and the second doped region has the second conductivity type; and
  forming a third doped region in the second well region, wherein the third doped region has the second conductivity type.

16. The method as claimed in claim 15, wherein forming the bipolar-CMOS-DMOS transistor further comprises:
  forming a first source electrode and a first drain electrode on the epitaxial layer, wherein the first source electrode is electrically connected to the first doped region and the second doped region, and the first drain electrode is electrically connected to the third doped region.

17. The method as claimed in claim 13, wherein forming the ultra-high voltage transistor comprises:
  forming a third well region in the epitaxial layer, wherein the third well region has the first conductivity type; and
  forming a fourth well region in the epitaxial layer, wherein the fourth well region is adjacent to the third well region and has a second conductivity type opposite to the first conductivity type, and the second isolation structure is formed in the fourth well region; and
  forming a second gate structure on the epitaxial layer, wherein the second gate structure is located above an interface between the third well region and the fourth well region, and a portion of the second isolation structure is covered by the second gate structure.

18. The method as claimed in claim 17, wherein forming the ultra-high voltage transistor further comprises:
  forming a fourth doped region and a fifth doped region in the third well region, wherein the fourth doped region has the first conductivity type, and the fifth doped region has the second conductivity type; and
  forming a sixth doped region in the fourth well region, wherein the sixth doped region has the second conductivity type.

19. The method as claimed in claim 18, wherein forming the ultra-high voltage transistor further comprises:
  forming a second source electrode and a second drain electrode on the epitaxial layer, wherein the second source electrode is electrically connected to the fourth doped region and the fifth doped region, and the second drain electrode is electrically connected to the sixth doped region.

* * * * *